United States Patent [19]

Kato

[11] Patent Number: 5,200,718

[45] Date of Patent: Apr. 6, 1993

[54] BALUN TRANSFORMER WITH COMMON MODE COIL

[75] Inventor: Tatsuo Kato, Tokyo, Japan

[73] Assignee: SMK Co., Ltd., Tokyo, Japan

[21] Appl. No.: 780,498

[22] Filed: Oct. 22, 1991

[30] Foreign Application Priority Data

Oct. 23, 1990 [JP] Japan ................................. 2-110647
Oct. 23, 1990 [JP] Japan ................................. 2-110648

[51] Int. Cl.⁵ ............................................. H03H 7/42
[52] U.S. Cl. ....................................... 333/25; 333/32
[58] Field of Search ................... 333/32, 25, 112, 119, 333/131; 336/180, 184

[56] References Cited

U.S. PATENT DOCUMENTS 4,201,962 5/1980 Hosoga ................................. 333/25

Primary Examiner—Paul Gensler
Attorney, Agent, or Firm—Lowe, Price, LeBlanc & Becker

[57] ABSTRACT

A balun transformer with a common mode coil is formed by parallel two-strand cable wound around a common core having through-holes through which the cable passes. The common mode coil can be connected either on the input side or the output side of the balun transformer. Because only one core is used to form both the balun transformer and the common mode coil, the outer dimensions of the transformer can be reached, along with manufacturing costs, to reduce the number of man-hours required to manufacture the transformer by this invention. This configuration also permits shorter connections between the balun transformer and the common mode coil.

2 Claims, 4 Drawing Sheets

BALUN TRANSFORMER WITH COMMON MODE COIL

BACKGROUND OF THE INVENTION

The present invention relates to an improved balun transformer used, for instance, to match the impedance of an antenna input circuit, and using a common mode coil for noise removal by coupling the common mode coil either at the input side or at the output side of the transformer.

With the conventional balun transformers 10 used for impedance conversion, as shown in FIG. 7 and FIG. 8, coils $L_1$, $L_2$, $L_3$ and $L_4$ are formed by winding parallel two-strand cables 14 around a spectacles-type core 12. Conversion of impedance (for example, between 300Ω and 75Ω) and balanced-unbalanced conversion (for example from a balanced state to an unbalanced state) is performed by wiring the subject coils between the 300Ω ends 16a and 16b as well as between 75Ω ends 18a and 18b.

The common mode coil 20 for removing noise (for example transmission noise), as shown in FIG. 7 and FIG. 8, is configured in such a way that the coils $L_5$, $L_6$, $L_7$ and $L_8$ are formed by winding parallel two-strand cables 24 around the spectacles-type core 22, separate from the spectacles core 12 for the balun transformer 10. The common mode coil is wired so that a signal (for example, one of 40 MHz to 960 MHz) incoming to the input terminals 26a and 26b from a 300Ω feeder line (not shown) is output at the output terminals 28a and 28b with the common mode noise component of the signal removed.

This conventional system is so designed that the output terminals 28a and 28b of the common mode coil 20 are connected to the 300Ω ends 16a and 16b on the input side of the balun transformer 10 to thus remove the noise and match the impedances.

However, in the conventional balun transformer 10 arrangement a parallel two-strand cable 24 is wound around the spectacles-type core 22, separate from the core 12 to form the common mode coil 20 for noise removal. Thus, when the balun transformer is coupled with the common mode coil 20 the resulting structure is too large to be incorporated into compact electric devices. Further, such a configuration leads to an increased number of components, increased manufacturing time and higher production costs. Also, the inherently longer connections between the balun transformer 10 and the common mode coil 20 are problematical in that noise is more likely to remain with the signal.

SUMMARY OF THE INVENTION

The present invention is intended to provide a balun transformer with a common mode coil having smaller outer dimensions, reduced number of parts, less manufacturing time, and a structure designed to prevent noise retention.

In a balun transformer with a common mode coil according to the present invention, the transformer core has through-holes through which parallel two-strand cables are passed and wound around the core on which both the balun transformer for impedance conversion and the common mode coils for noise removal are built up. The common mode coil can be connected either at the input side or output side of the balun transformer.

Because the balun transformer and coils can thus have a core in common around which parallel two-strand cables are wound up, they have smaller outer dimensions, fewer components and require less manufacturing time than for conventional balun transformers with which common mode coils have been formed on a separate core. Further the configuration by this invention permits shorter connections between the balun transformer and common mode coil.

The objects and features of the invention appear more fully hereunder from consideration of the following description taken in connection with the accompanying drawings.

DETAILED DESCRIPTION OF THE INVENTION

Figure 1:
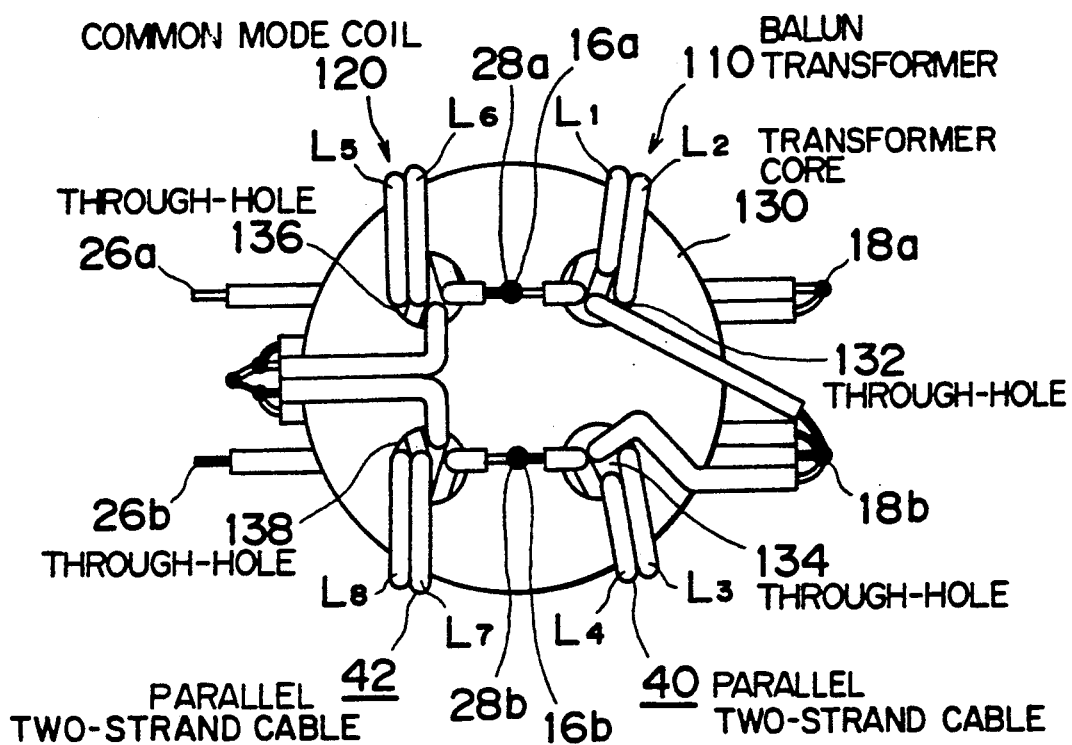
FIG. 1 is a plan view illustrating a balun transformer with a common mode coil suitable for carrying out several embodiments of the present invention.
Figure 2:
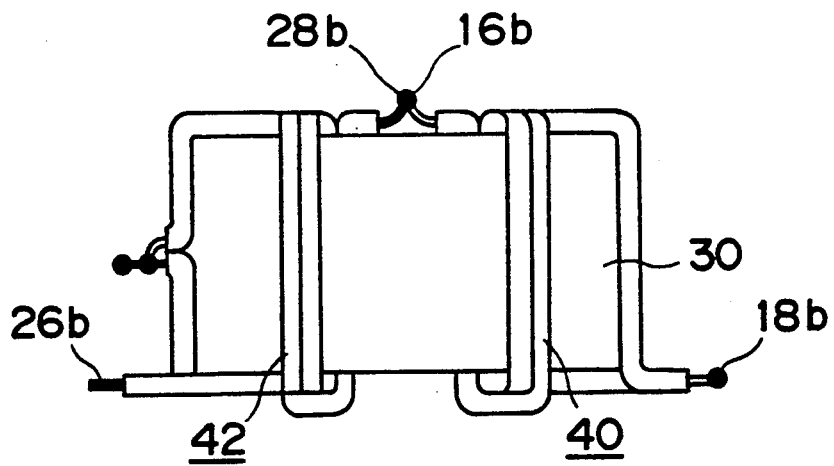
FIG. 2 is an elevational view of FIG. 1.
Figure 3:
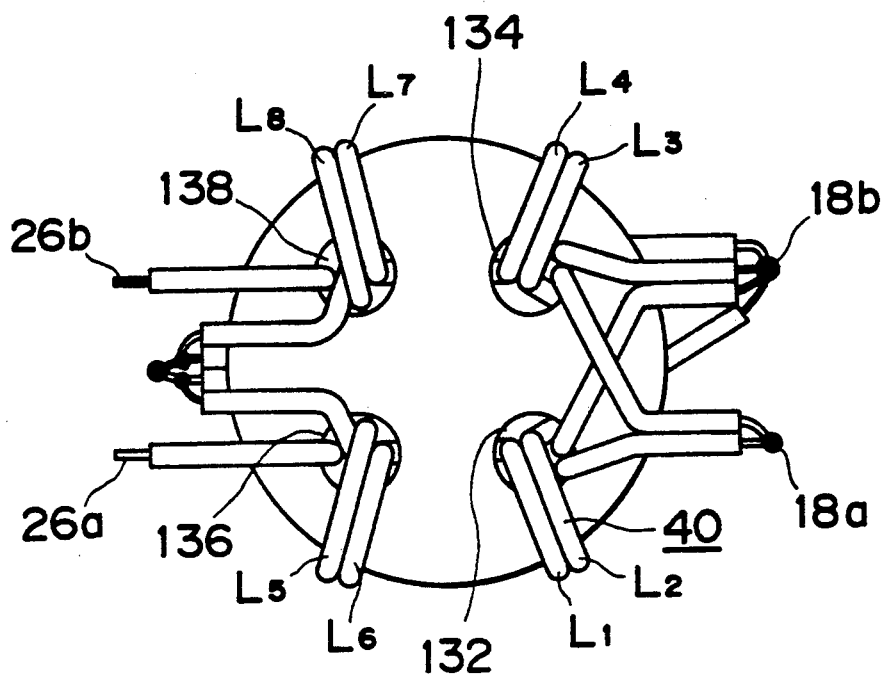
FIG. 3 is a bottom plan view of FIG. 2.
Figure 7:
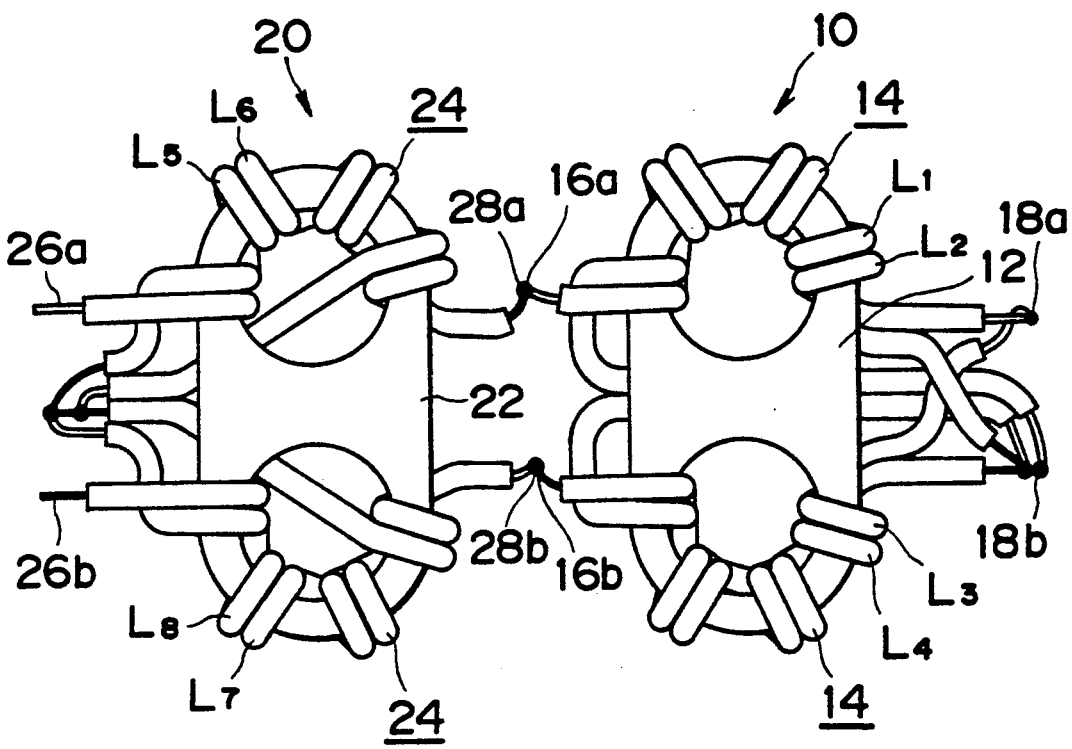
FIG. 7 is a plan view which depicts a conventional balun transformer with conventional common mode coil.
Figure 8:
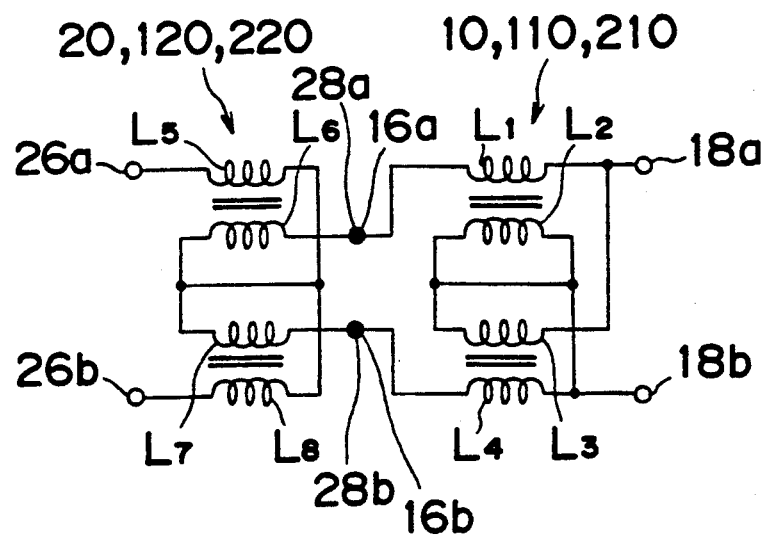
FIG. 8 is a schematic diagram of one form of electric circuit connecting a common mode coil to a balun transformer; a diagram common to this invention and conventional arrangements.

FIG. 1 through FIG. 3 illustrate a preferred embodiment of this invention, where reference numbers designate like or corresponding parts as in FIG. 7 and FIG. 8.

In FIG. 1 through FIG. 3, the numerical 130 represents a short, circular cylindrical core made from such magnetic material as ferrite.

Though the core material is not limited to ferrite, the ferrite core is advantageous in the sense that it allows the reduction of outside dimensions of the balun transformer according to this invention.

Four through-holes 132, 134, 136 and 138 are formed in core 130, two of which 132 and 134 permit a parallel two-strand cable to pass therethrough. By winding this cable 40 around the core 130 a balun transformer 110 is formed with four coils $L_1$, $L_2$, $L_3$ and $L_4$. By winding a parallel two-strand cable 42 around the core 130 through the remaining through-holes 136 and 138 a common mode coil 120 having four coils $L_5$, $L_6$, $L_7$ and $L_8$ is formed. The 300Ω input side terminals 16a and 16b of the balun transformer 110 are connected to the output terminals 28a and 28b of the common mode coil 120. Because the balun transformer 110 and the common mode coil 120 have core 130 in common, a decrease in the number of parts and manufacturing time is realized. Further it allows connections between the transformer 110 and coil 120 to be as short as practicable.

When a certain signal, for instance of 40 MHz to 960 MHz is input at the input terminals 16a and 26b of the common mode coil from, for example, a 300Ω feeder line (not shown), the common mode noise remaining with the signal is removed by the common mode coil 120. Then the balun transformer 110 converts feeder line impedance from 300Ω into 75Ω and a balanced state into an unbalanced state with the signal sent to a tuner from the 75Ω side terminals 18a and 18b on the output side of the balun transformer 110.

Though in the foregoing embodiment, four through-holes are formed in a single transformer core through which a parallel two-strand cable runs to be wound around the core thus constituting the balun transformer and another parallel two-strand cable runs through the remaining two holes to be wound around the same core, this invention is not limited to this embodiment. Through-holes may be made in a core through which a parallel two-strand cable may run to be wound around the core to thus constitute both a balun transformer for impedance conversion and a common mode coil to remove noise.

Figure 4:
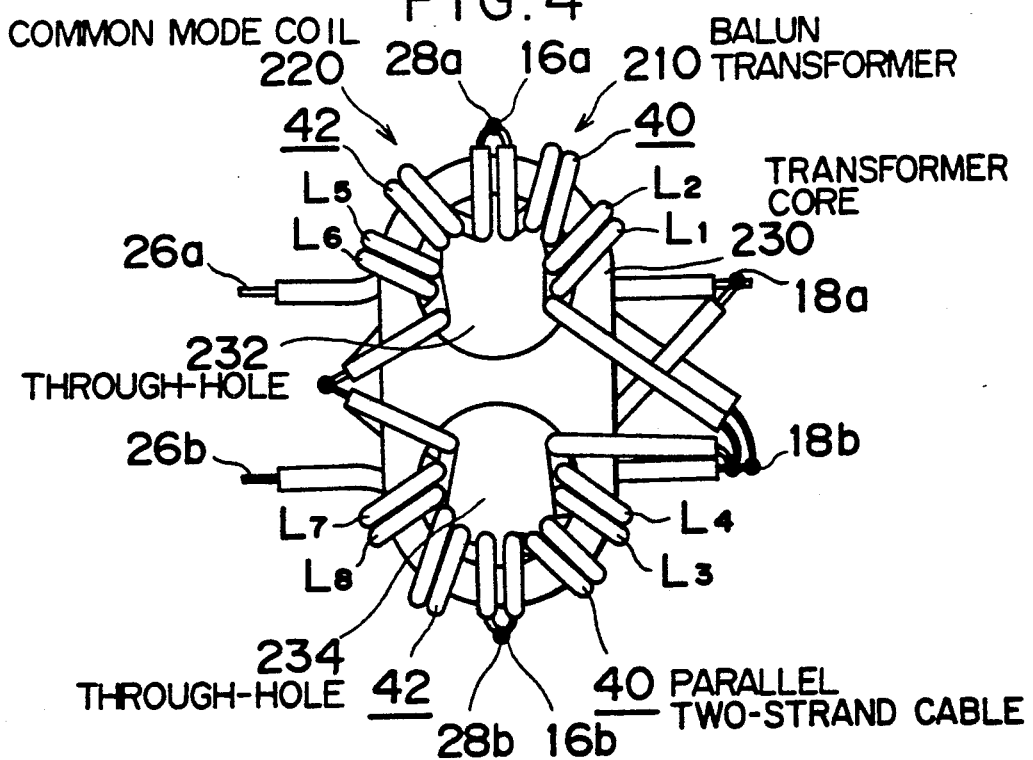
FIG. 4 is an elevation view illustrating another embodiment of this invention.
Figure 5:
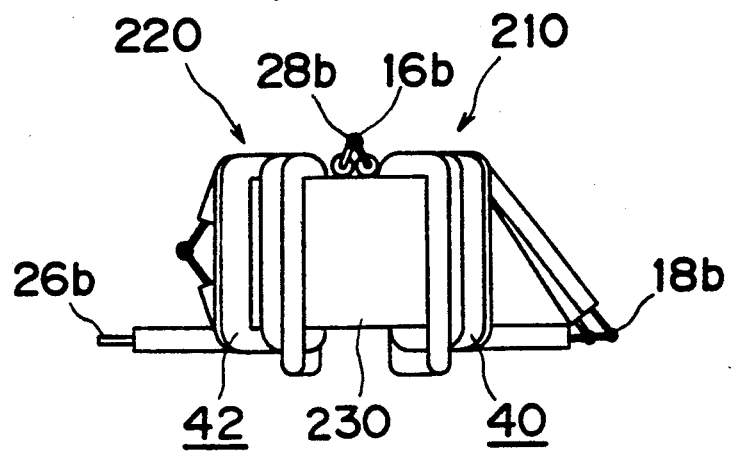
FIG. 5 is an elevational view of FIG. 4.
Figure 6:
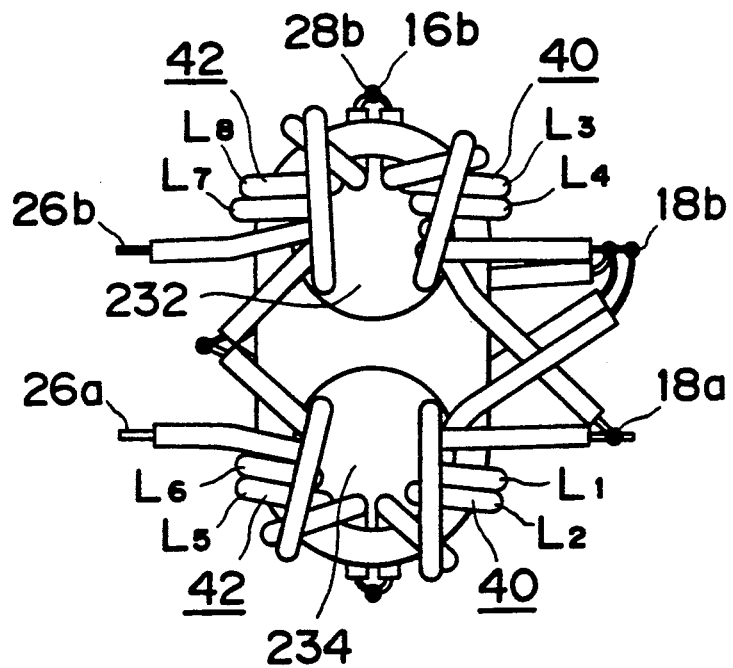
FIG. 6 is a bottom plan view of FIG. 5.

For instance two through-holes can be forced in a core, as shown in FIG. 4 through FIG. 6, wherein a parallel two-strand cable passing through these two holes can be wound around the core to thus make up a balun transformer for impedance conversion and a common mode coil for removing noise.

Other embodiments of this invention are illustrated in FIG. 4 through FIG. 6, where the numeral 230 represents a core, for instance, a spectacles-type core made from such magnetic material as ferrite. Two through-holes 232 and 234 have been formed in the foregoing 230. Winding a parallel two-strand cable 40 going across the negative side (righthand side in the figures) of the foregoing two holes, around the same core 230 allows a balun transformer 210 provided with coils $L_1$, $L_2$, $L_3$ and $L_4$ to be constituted while winding, on the core 230, another parallel two-strand cable 42 running across the other of the two holes 232 and 234 (on the left-hand side in the figures) makes up a common mode coil 220 provided with coils $L_5$, $L_6$, $L_7$ and $L_8$. To the 300Ω side terminals 16a and 16b of the balun transformer 210, are connected the output terminals 28a and 28b of the common mode coil 220. Since in this configuration the balun transformer 210 and the common mode coil 220 have the core 230 in common, the device as a whole can be more compact with fewer parts, reduced manufacture time and the connections therebetween can be shortened to be as practical as possible.

Because the balun transformer with common mode coil of this invention has a common core both for the balun transformer portion and common mode coil portion, and has smaller outside dimensions, fewer parts, and less manufacturing time than the prior art wherein the core for the balun transformer was formed separately from that for common mode coil, the invention therefore affords a reduction in production cost. Furthermore the reduced length of the connection line between the balun transformer and the common mode coil contributes to the prevention of noise interference.

What is claimed is:

1. A balun transformer with a common mode coil characterized in that parallel two-strand cable wound around a core having through-holes through which said cable passes composes both a balun transformer for converting impedance and a common mode coil for removal of noise, wherein the common mode coil is configured to be connected to one of an input side and an output side of said balun transformer, and wherein four of said through-holes are formed in the core, two of which allow a first parallel two-strand cable to pass therethrough constituting said balun transformer for impedance conversion and a winding of another parallel two-strand cable passing through the remaining two holes constituting a common coil for noise removal.

2. A balun transformer with common mode coil as claimed in claim1, in which the core is made from ferrite and the balun transformer can perform impedance conversion from 300Ω to 75Ω and from a balanced state to an unbalanced state, as well as conversion from 75Ω to 300Ω and from an unbalanced state to a balanced state.

* * * * *